(12) United States Patent
Hu (10) Patent No.: US 10,453,802 B2
(45) Date of Patent: Oct. 22, 2019

(54) SEMICONDUCTOR PACKAGE STRUCTURE, SEMICONDUCTOR DEVICE AND METHOD FOR MANUFACTURING THE SAME

(71) Applicant: Advanced Semiconductor Engineering, Inc., Kaohsiung (TW)

(72) Inventor: Ian Hu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/691,455

(22) Filed: Aug. 30, 2017

(65) Prior Publication Data

US 2019/0067207 A1 Feb. 28, 2019

(51) Int. Cl.
*H01L 23/552* (2006.01)
*H01L 23/31* (2006.01)
(Continued)

(52) U.S. Cl.
CPC ........ *H01L 23/552* (2013.01); *H01L 21/4871* (2013.01); *H01L 21/56* (2013.01); *H01L 23/13* (2013.01); *H01L 23/3192* (2013.01); *H01L 23/36* (2013.01); *H01L 23/49838* (2013.01); *H01L 23/49866* (2013.01); *H01L 23/5383* (2013.01); *H01L 23/5384* (2013.01); *H01L 23/5385* (2013.01); *H01L 25/0652* (2013.01); *H01L 2224/16225* (2013.01); *H01L 2224/73253* (2013.01); *H01L 2224/94* (2013.01); *H01L 2224/97* (2013.01); *H01L 2225/06517* (2013.01); *H01L 2225/06537* (2013.01); *H01L 2225/06572* (2013.01); *H01L 2225/06589* (2013.01); *H01L 2924/15192* (2013.01);
(Continued)

(58) Field of Classification Search
CPC . H01L 23/552; H01L 123/42; H01L 21/4871; H01L 21/56; H01L 23/49866; H01L 23/36; H01L 23/3192; H01L 23/49838; H01L 23/367; H01L 23/5385; H01L 23/13; H01L 23/5383; H01L 23/5384
USPC ...................................................... 257/659
See application file for complete search history.

(56) References Cited

U.S. PATENT DOCUMENTS 8,390,106 B2 * 3/2013 Maeda ................ H01L 23/3128
257/678
9,293,446 B2 * 3/2016 Matsumoto ............. H01L 25/16
(Continued)

FOREIGN PATENT DOCUMENTS

TW           I442531 B       6/2014

*Primary Examiner* — Luan C Thai
(74) *Attorney, Agent, or Firm* — Foley & Lardner LLP; Cliff Z. Liu (57) ABSTRACT

A semiconductor package structure includes a substrate, at least one first semiconductor element, a heat dissipation structure and an insulation layer. The at least one first semiconductor element is attached to the substrate, and has a first surface and a second surface opposite to the first surface. The first surface of the at least one first semiconductor element faces the substrate. The heat dissipation structure is disposed on the second surface of the at least one first semiconductor element. The insulation layer is disposed on the heat dissipation structure, and defines a plurality of openings extending through the insulation layer and exposing a plurality of exposed portions of the heat dissipation structure.

19 Claims, 9 Drawing Sheets

(51) Int. Cl.
  *H01L 23/36* (2006.01)
  *H01L 23/498* (2006.01)
  *H01L 21/56* (2006.01)
  *H01L 21/48* (2006.01)
  *H01L 23/13* (2006.01)
  *H01L 23/538* (2006.01)
  *H01L 25/065* (2006.01)

(52) U.S. Cl.
  CPC ............... *H01L 2924/15311* (2013.01); *H01L 2924/15313* (2013.01); *H01L 2924/19105* (2013.01); *H01L 2924/3025* (2013.01)

(56) References Cited

U.S. PATENT DOCUMENTS

| | | |
|---|---|---|
| 9,875,970 B2* | 1/2018 | Yi ........................ H01L 23/5389 |
| 9,935,083 B2* | 4/2018 | Lee ..................... H01L 25/0657 |
| 2011/0001230 A1 | 1/2011 | Li et al. |
| 2016/0064329 A1* | 3/2016 | Lee ..................... H01L 23/5389 |
| | | 257/659 |
| 2016/0211221 A1* | 7/2016 | Kim ........................ H01L 23/552 |
| 2017/0256474 A1* | 9/2017 | Fujinaga ............. H01L 23/3675 |
| 2018/0096927 A1* | 4/2018 | Kim .................. H01L 23/49822 |

* cited by examiner

SEMICONDUCTOR PACKAGE STRUCTURE, SEMICONDUCTOR DEVICE AND METHOD FOR MANUFACTURING THE SAME

BACKGROUND

1. Field of the Disclosure

The present disclosure relates to a semiconductor package structure, a semiconductor device and a packaging method, and to a semiconductor package structure including a heat dissipation structure, a semiconductor device including the same and a method for manufacturing the semiconductor package structure.

2. Description of the Related Art

Some design characteristics of some semiconductor package structures provide for high speed data transmission, high capacity and a small size. Heat dissipation may be an issue for such a semiconductor package structure. During operation, high speed data transmission can result in a significant amount of heat being generated and can raise a temperature of the semiconductor package structure. Due to the small size of the semiconductor package structure, it can be difficult to dissipate the heat. If the heat is not dissipated efficiently, the performance of the semiconductor package structure can be lowered, or the semiconductor package structure may break down or be rendered inoperative.

SUMMARY

In some embodiments according to an aspect, a semiconductor package structure includes a substrate, at least one first semiconductor element, a heat dissipation structure and an insulation layer. The at least one first semiconductor element is attached to the substrate, and has a first surface and a second surface opposite to the first surface. The first surface of the at least one first semiconductor element faces the substrate. The heat dissipation structure is disposed on the second surface of the at least one first semiconductor element. The insulation layer is disposed on the heat dissipation structure, and defines a plurality of openings extending through the insulation layer and exposing a plurality of exposed portions of the heat dissipation structure.

In some embodiments according to another aspect, a semiconductor device includes a semiconductor package structure, a circuit board and a plurality of first conductive elements. The semiconductor package structure includes a substrate, at least one first semiconductor element, a heat dissipation structure and an insulation layer. The at least one first semiconductor element is attached to the substrate, and has a first surface and a second surface opposite to the first surface. The first surface of the at least one first semiconductor element faces the substrate. The heat dissipation structure is disposed on the second surface of the at least one first semiconductor element. The insulation layer is disposed on the heat dissipation structure, and defines a plurality of openings extending through the insulation layer and exposing a plurality of exposed portions of the heat dissipation structure. The circuit board is disposed apart from the semiconductor package structure by the plurality of first conductive elements. The first conductive elements connect the exposed portions of the heat dissipation structure to the circuit board.

In some embodiments according to another aspect, a method for manufacturing a semiconductor package structure includes providing at least one first semiconductor element having a first surface and a second surface opposite to the first surface, and forming a heat dissipation structure on the second surface of the at least one first semiconductor element. The method further includes forming an insulation layer on the heat dissipation structure, wherein the insulation layer defines a plurality of openings extending through the insulation layer and exposing a plurality of portions of the heat dissipation structure, and mounting the at least one first semiconductor element to a substrate.

BRIEF DESCRIPTION OF THE DRAWINGS

Characteristics of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Common reference numerals are used in the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In some semiconductor package structures, a plurality of semiconductor elements (e.g., semiconductor dice and passive elements) are attached to one side of a package substrate, and an encapsulant is formed on the package substrate to cover the semiconductor elements. A size of the package substrate of such semiconductor package structure may be about 11.7 millimeters (mm)×about 8.9 mm. A maximum junction temperature ($T_J$) between the semiconductor die and the package substrate is about 70.1 degrees Celsius (° C.). In order to reduce the size of the package substrate, a semiconductor package structure with double side molding may be provided. In such a semiconductor package structure, some semiconductor element(s) (top semiconductor element(s)) are disposed on a top side of the package substrate, and other semiconductor element(s) (bottom semiconductor element(s)) and a plurality of connectors (e.g. copper core balls) are disposed on a bottom side of the package substrate. A top encapsulant is formed on the top side of the package substrate to cover the top semiconductor elements, and a bottom encapsulant is formed on the bottom side of the package substrate to cover the bottom semiconductor element(s) and expose a portion of each of the copper core balls. Thus, the size of the package substrate can be reduced to about 9.6 mm×about 8.6 mm. However, the maximum junction temperature ($T_J$) between the semiconductor die and the package substrate will increase to about 145.2° Celsius (C).

In order to further reduce the size of the package substrate, in a comparative structure, the copper core balls may be replaced by an interposer and a plurality of solder balls. In the comparative structure, the size of the package substrate can be reduced to about 9.2 mm×about 8 mm. During operation, the semiconductor package structure of the comparative structure may be attached to a mother board such as a printed circuit board (PCB). In a first example, the semiconductor package structure of the comparative structure is attached to a PCB through a plurality of solder balls with a thermal conductivity of about 60 watts per meter-kelvin (W/mK). A thermal resistance $\theta_{JA}$ is defined as $(T_J-T_A)/P$, where $T_J$ is a junction temperature between the semiconductor die and the package substrate, $T_A$ is an ambient temperature and P is power dissipation. The conditions of the first example are: $T_J$ is 84.0° C., $T_A$ is 25° C., P is 2.01 W, and $\theta_{JA}$ is 29.3° C./W. In a second example, the semiconductor package structure of the comparative structure is attached to the PCB through a plurality of solder balls with a thermal conductivity of 60 W/mK and an underfill with a thermal conductivity of 0.5 W/mK. The underfill is disposed between the bottom encapsulant and the PCB and covers the solder balls. The conditions of the second example are: $T_J$ is 83.1° C., $T_A$ is 25° C., P is 2.01 W, and $\theta_{JA}$ is 28.9° C./W. That is, the second example has about a 1% improvement in thermal resistance as compared with the first example. In a third example, the semiconductor package structure of the comparative structure is attached to the PCB through a plurality of solder balls with a thermal conductivity of 60 W/mK and a thermal interface material (TIM) with a thermal conductivity of 4 W/mK. The thermal interface material (TIM) is disposed between the bottom encapsulant and the PCB and covers the solder balls. The conditions of the third example are: $T_J$ is 82.3° C., $T_A$ is 25° C., P is 2.01 W, and $\theta_{JA}$ is 28.5° C./W. That is, the third example has a about a 2% improvement in thermal resistance as compared with the first example. As stated above, the efficiency of such heat dissipation techniques of the three examples is limited.

To address at least the above concerns, the present disclosure describes an improved semiconductor package structure according to some embodiments. The semiconductor package structure includes a heat dissipation structure and an insulation layer. The heat dissipation structure is disposed on a surface of the bottom semiconductor element(s) exposed from the bottom encapsulant. The insulation layer is disposed on the heat dissipation structure, and defines a plurality of openings to expose a plurality of portions of the heat dissipation structure. Thus, the heat can be dissipated from the bottom semiconductor element(s) directly. Furthermore, the heat dissipation structure can be connected to a plurality of conductive elements with high thermal conductivity. Such configurations may dissipate the heat generated by the bottom semiconductor element(s) to the PCB quickly. Thus, highly efficient heat dissipation can be achieved.

Figure 1:
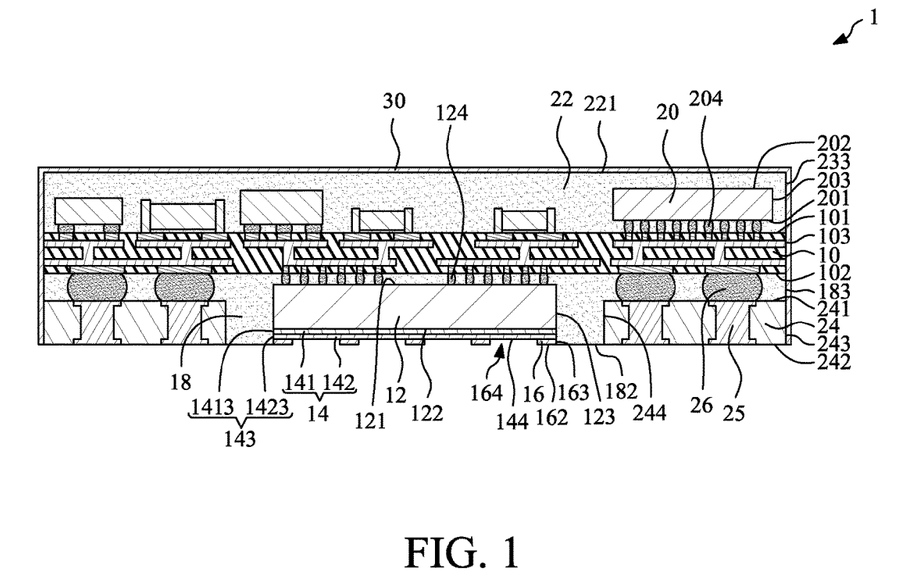
FIG. 1 illustrates a cross-sectional view of some embodiments of a semiconductor package structure according to an aspect of the present disclosure.

FIG. 1 illustrates a cross-sectional view of some embodiments of a semiconductor package structure 1 according to an aspect of the present disclosure. The semiconductor package structure 1 may be a semiconductor package structure with double side molding, and includes a substrate 10, at least one first semiconductor element 12, a heat dissipation structure 14, an insulation layer 16, a first encapsulant 18, at least one second semiconductor element 20, a second encapsulant 22, an interposer 24 and a plurality of electrical connectors 26.

The substrate 10 can be a package substrate, and can have a first surface 101, a second surface 102 and a side surface 103. The second surface 102 is opposite to the first surface 101, and the side surface 103 extends between the first surface 101 and the second surface 102. The substrate 10 may be an organic substrate or an inorganic substrate. For example, the material of the substrate 10 may include a glass-reinforced epoxy resin material (e.g., an FR4 grade material), bismaleimide triazine (BT), epoxy, silicon, PCB material, glass or ceramic.

The first semiconductor element 12 is attached to and/or electrically connected to the second surface 102 of the substrate 10. In some embodiments, the first semiconductor element 12 may include at least one semiconductor die (e.g., a WiFi module) and/or at least one passive element. The first semiconductor element 12 has a first surface 121 (e.g., an active surface), a second surface 122 (e.g., a back side surface) and a side surface 123. The second surface 122 is opposite to the first surface 121, and the side surface 123 extends between the first surface 121 and the second surface 122. The first surface 121 of the first semiconductor element 12 faces the second surface 102 of the substrate 10, and is electrically connected to the second surface 102 of the substrate 10 through a plurality of first interconnection elements 124, such as bumps or pillars. For example, the first semiconductor element 12 may be attached to the second surface 102 of the substrate 10 by flip chip bonding.

The heat dissipation structure 14 is disposed on the second surface 122 of the first semiconductor element 12 and can provide for dissipating heat generated by the first semiconductor element 12. In one or more embodiments, the heat dissipation structure 14 may include a first metal layer 141, and a material of the first metal layer 141 may include copper or another metal or metal alloy. In one or more embodiments, the heat dissipation structure 14 further includes a second metal layer 142 disposed on the first metal layer 141. That is, at least a portion of the first metal layer 141 is disposed between the second metal layer 142 and the second surface 122 of the first semiconductor element 12. A material of the second metal layer 142 may include nickel, gold, a gold-nickel alloy, a nickel-vanadium alloy, palladium or molybdenum. As shown in FIG. 1, a length of the heat dissipation structure 14 (including the first metal layer 141 and the second metal layer 142) is substantially equal to a length of the second surface 122 of the first semiconductor element 12 (e.g. the heat dissipation structure 14 is co-extensive with the first semiconductor element 12). The heat dissipation structure 14 (including the first metal layer 141 and the second metal layer 142) may cover the second surface 122 of the first semiconductor element 12 from a bottom side. A side surface 143 (including a side surface 1413 of the first metal layer 141 and a side surface 1423 of the second metal layer 142) of the heat dissipation structure 14 is substantially coplanar with the side surface 123 of the first semiconductor element 12.

The insulation layer 16 is disposed on the heat dissipation structure 14, and defines a plurality of openings 164 extending through the insulation layer 16 to expose a plurality of exposed portions 144 of the heat dissipation structure 14. In one or more embodiments, a material of the insulation layer 16 includes a polyimide, polybenzobisoxazole, a polyamide, a photodefinable dielectric material (e.g. TMMR manufactured by TOKYO OHKA KOGYO CO., LTD.), a solder resist or a combination thereof. As shown in FIG. 1, the insulation layer 16 is disposed on the second metal layer 142 of the heat dissipation structure 14, and has a side surface 163 and a second surface 162. The side surface 163 of the insulation layer 16 is substantially coplanar with the side surface 143 (including the side surface 1413 of the first metal layer 141 and the side surface 1423 of the second metal layer 142) of the heat dissipation structure 14.

The interposer 24 has a first surface 241, a second surface 242 and a side surface 243, and defines a through hole 244. The second surface 242 is opposite to the first surface 241, and the side surface 243 extends between the first surface 241 and the second surface 242. The through hole 244 extends through the interposer 24. The material of the interposer 24 may include an organic material or an inorganic material. For example, the material of the interposer 24 may include a glass-reinforced epoxy resin material (e.g., an FR4 grade material), bismaleimide triazine (BT), epoxy, silicon, PCB material, glass or ceramic. The first surface 241 of the interposer 24 is attached to the second surface 102 of the substrate 10 through the electrical connectors 26. The through hole 244 can be used for accommodating the first semiconductor element 12. The first semiconductor element 12 is located in the through hole 244 of the interposer 24. In one or more embodiments, the interposer 24 may include a plurality of conductive vias 25 extending through the interposer 24 and disposed around the through hole 244. The material of the conductive vias 25 may include copper or another metal or metal alloy.

The electrical connectors 26 are disposed between the first surface 241 of the interposer 24 and the second surface 102 of the substrate 10 so as to physically connect and electrically connect the interposer 24 to the substrate 10. The electrical connectors 26 may be solder balls, and may be connected to a top end of a respective one of the conductive vias 25, whereas a bottom end of each of the conductive vias 25 may be exposed from the interposer 24 for external connection. In one or more embodiments, a combination of the electrical connector 26 and the conductive via 25 constitutes an internal connector. One end of the internal connector is electrically connected to the substrate 10, and the other end of the internal connector is exposed for external connection. It is noted that the combination of the electrical connector 26 and the conductive via 25 may be replaced by a solder ball, two stacked solder ball, or a conductive via, for example. As shown in FIG. 1, a sum of a height of the first interconnection element 124, a thickness of the first semiconductor element 12, a thickness of the heat dissipation structure 14 (including the first metal layer 141 and the second metal layer 142) and a thickness of the insulation layer 16 is substantially equal to a sum of a height of the electrical connector 26 and a length of the conductive via 25. The bottom surface 242 of the interposer 24 may be substantially coplanar with the second surface 162 of the insulation layer 16.

The first encapsulant 18 is disposed on the second surface 102 of the substrate 10, and extends into the gap between the first semiconductor element 12 and a sidewall of the through hole 244. Thus, the first encapsulant 18 covers at least a portion of the side surface 123 of the first semiconductor element 12, and further covers the interposer 24 and the electrical connector 26. The material of the first encapsulant 18 may include a molding compound. The first encapsulant 18 has a second surface 182 and a side surface 183. The second surface 182 of the first encapsulant 18 is substantially coplanar with the second surface 242 of the interposer 24 and the second surface 162 of the insulation layer 16. For example, the first encapsulant 18 does not substantially extend onto the second surface 162 of the insulation layer 16. Thus, the insulation layer 16 and the exposed portions 144 of the heat dissipation structure 14 may be exposed from the first encapsulant 18. The side surface 183 of the first encapsulant 18 may be substantially coplanar with the side surface 103 of the substrate 10 and the side surface 243 of the interposer 24. In addition, a portion of the first encapsulant 18 may further extend into the space between the first semiconductor element 12 and the second surface 102 of the substrate 10 to surround and protect the first interconnection elements 124 (e.g., the first encapsulant 18 may serve as a molded underfill (MUF)). In some embodiments, there may be an underfill disposed in the space between the first semiconductor element 12 and the second surface 102 of the substrate 10 to surround and protect the first interconnection elements 124.

The second semiconductor element 20 is attached to and/or electrically connected to the first surface 101 of the substrate 10. In some embodiments, the second semiconductor element 20 may include at least one semiconductor die (e.g., a WiFi module) and/or at least one passive element. The second semiconductor element 20 has a first surface 201 (e.g., an active surface), a second surface 202 (e.g., a back side surface) and a side surface 203. The second surface 202 is opposite to the first surface 201, and the side surface 203 extends between the first surface 201 and the second surface 202. The first surface 201 of the second semiconductor element 20 faces the first surface 101 of the substrate 10, and is electrically connected to the first surface 101 of the substrate 10 through a plurality of second interconnection elements 204, such as bumps or pillars. For example, the second semiconductor element 20 may be attached to the first surface 101 of the substrate 10 by flip chip bonding.

The second encapsulant 22 is disposed on the first surface 101 of the substrate 10 to cover the second semiconductor element 20. The material of the second encapsulant 22 may include a molding compound. The second encapsulant 22 has a first surface 221 and a side surface 223. The first surface 221 of the second encapsulant 22 is higher than the second surface 202 of the second semiconductor element 20. In some embodiments, the first surface 221 of the second encapsulant 22 may be substantially coplanar with the second surface 202 of the second semiconductor element 20. For example, the second semiconductor element 20 may be exposed from the second encapsulant 22. Further, the side surface 223 of the second encapsulant 22 may be substantially coplanar with the side surface 103 of the substrate 10. In addition, a portion of the second encapsulant 22 may further extend into the space between the second semiconductor element 20 and the first surface 101 of the substrate 10 to surround and protect the second interconnection elements 204 (e.g., the second encapsulant 22 may serve as a MUF). In some embodiments, there may be an underfill disposed in the space between the second semiconductor element 20 and the first surface 101 of the substrate 10 to surround and protect the second interconnection elements 204.

In one or more embodiments, the semiconductor package structure 1 may further include a shielding layer 30 disposed on the first surface 221 and the side surface 223 of the second encapsulant 22, the side surface 103 of the substrate 10, the side surface 183 of the first encapsulant 18 and the side surface 243 of the interposer 24. The shielding layer 30 may include at least one metal layer so as to shield the semiconductor package structure 1 from electromagnetic noise from the ambient environment.

In the embodiments illustrated in FIG. 1, the heat dissipation structure 14 is disposed on the second surface 122 of the first semiconductor element 12 directly, so that the heat generated in the semiconductor package structure 1 (e.g., the heat generated by the first semiconductor element 12) can be dissipated by the exposed portions 144 of the heat dissipation structure 14 quickly. In addition, the exposed portions 144 of the heat dissipation structure 14 are separated from each other by the pattern design of the insulation layer 16, thus, when the semiconductor package structure 1 is attached to a circuit board 32 (see FIG. 7), first conductive elements 34 (see FIG. 7) can hold the semiconductor package structure 1 evenly. Therefore, the semiconductor package structure 1 will not tilt, and a non-wetting issue of second conductive elements 36 (see FIG. 7) can be reduced. That is, the risk of surface mount technology (SMT) failure will be lowered.

Figure 2:
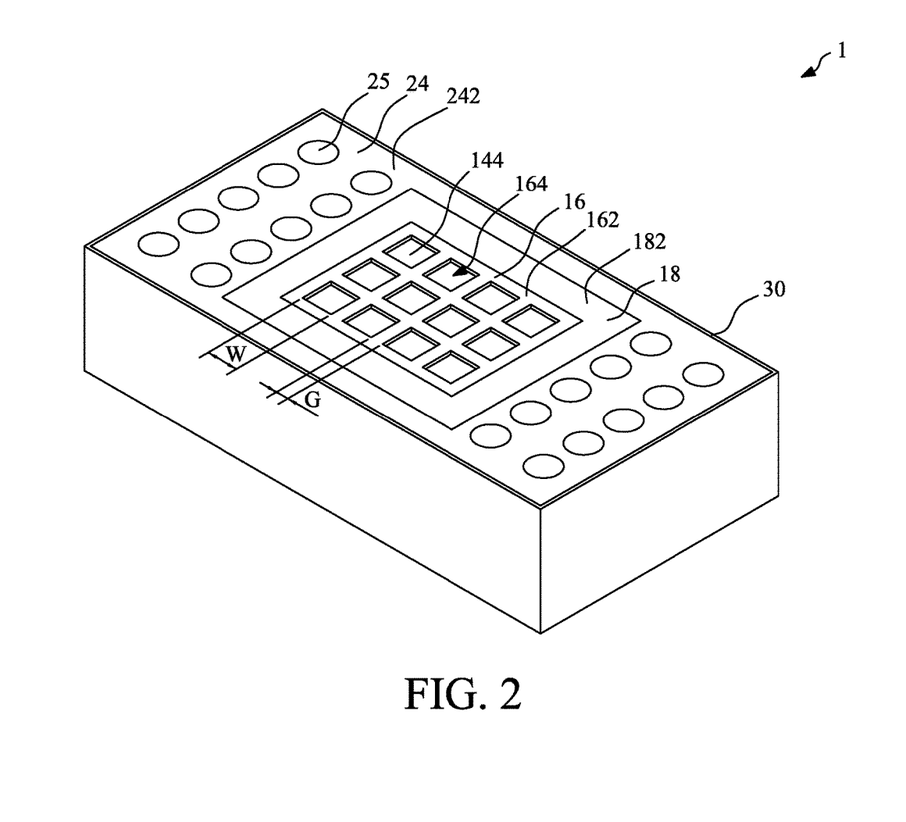
FIG. 2 illustrates a bottom perspective view of some embodiments of the semiconductor package structure of FIG. 1.

FIG. 2 illustrates a bottom perspective view of some embodiments of the semiconductor package structure 1 shown in FIG. 1. In one or more embodiments, the openings 164 of the insulation layer 16 may be arranged regularly or irregularly. As shown in FIG. 2, the openings 164 of the insulation layer 16 are in an array, and each of the openings 164 is in a substantially square shape. A width W of the opening 164 of the insulation layer 16 is in a range of about 0.1 mm to about 3 mm, or about 0.5 mm to about 3 mm. If the width W of the opening 164 is too small, the efficiency of heat dissipation will be poor; and if the width W of the opening 164 is too large, the above-mentioned non-wetting issue (SMT failure) may readily occur. It is noted that a size of the opening 164 may correspond to a size of the first conductive element 34 (see FIG. 7). In addition, a gap G between two openings 164 of the insulation layer 16 is in a range of about 0.1 mm to about 0.5 mm. If the gap G between the opening 164 is too small, a risk of the bridge between the first conductive elements 34 (see FIG. 7) is high; and if the gap G between the opening 164 is too large, the efficiency of heat dissipation will be poor.

Figure 3:
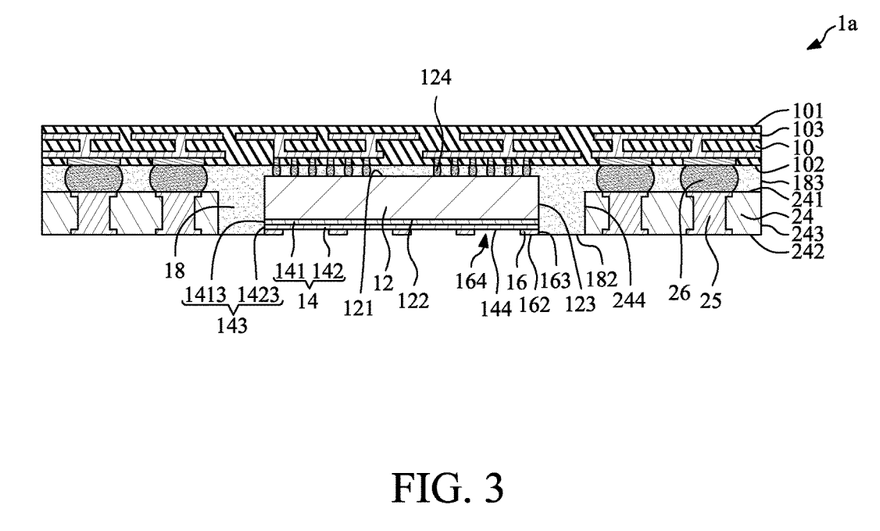
FIG. 3 illustrates a cross-sectional view of some embodiments of a semiconductor package structure according to an aspect of the present disclosure.

FIG. 3 illustrates a cross-sectional view of some embodiments of a semiconductor package structure 1a according to an aspect of the present disclosure. The semiconductor package structure 1a shown in FIG. 3 is similar to the semiconductor package structure 1 as shown in FIG. 1, except that the second semiconductor element 20, the second encapsulant 22 and the shielding layer 30 are omitted. That is, the semiconductor package structure 1a shown in FIG. 3 is a semiconductor package structure with one side molding.

Figure 4:
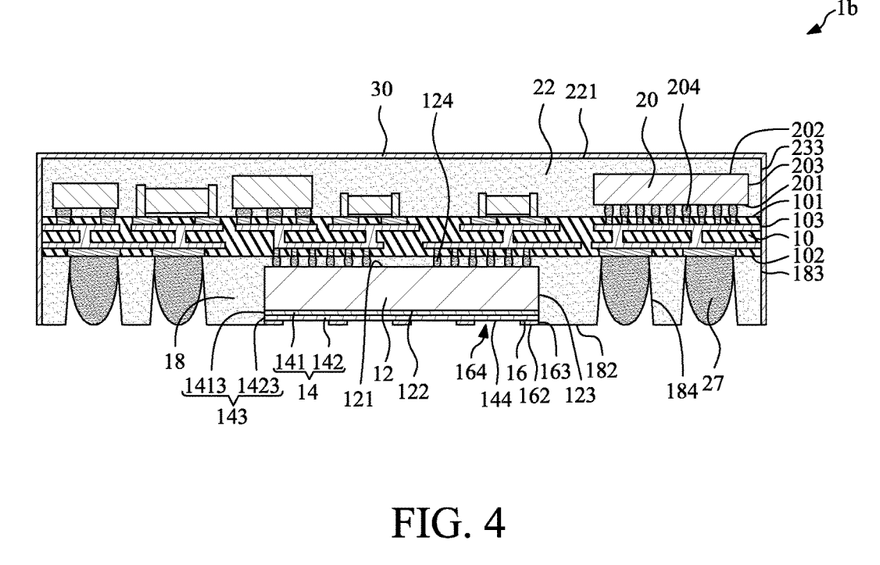
FIG. 4 illustrates a cross-sectional view of some embodiments of a semiconductor package structure according to an aspect of the present disclosure.

FIG. 4 illustrates a cross-sectional view of some embodiments of a semiconductor package structure 1b according to an aspect of the present disclosure. The semiconductor package structure 1b shown in FIG. 4 is similar to the semiconductor package structure 1 as shown in FIG. 1, except that the electrical connectors 26 and the interposer 24 is replaced by a plurality of solder connectors 27. That is, the internal connectors of the semiconductor package structure 1b shown in FIG. 4 are the solder connectors 27. In addition, the first encapsulant 18 defines a plurality of openings 184 extending through the first encapsulant 18 to expose portions of the second surface 102 of the substrate 10. The openings 184 may be formed by, for example, a laser ablation conducted on the second surface 182 of the first encapsulant 18. The positions of the openings 184 of the first encapsulant 18 may correspond to the positions of the electrical connectors 26 shown in FIG. 1. The solder connectors 27 are each disposed in a respective one of the openings 184 of the first encapsulant 18 to connect the second surface 102 of the substrate 10. The solder connector 27 may be formed by a solder ball or two stacked solder balls. A height of the solder connector 27 may be substantially equal to, or at least equal to, a sum of a height of the first interconnection elements 124, a thickness of the first semiconductor element 12, a thickness of the heat dissipation structure 14 (including the first metal layer 141 and the second metal layer 142) and a thickness of the insulation layer 16. Thus, a bottom end of the solder connector 27 may be exposed from the second surface 182 of the first encapsulant 18.

Figure 5:
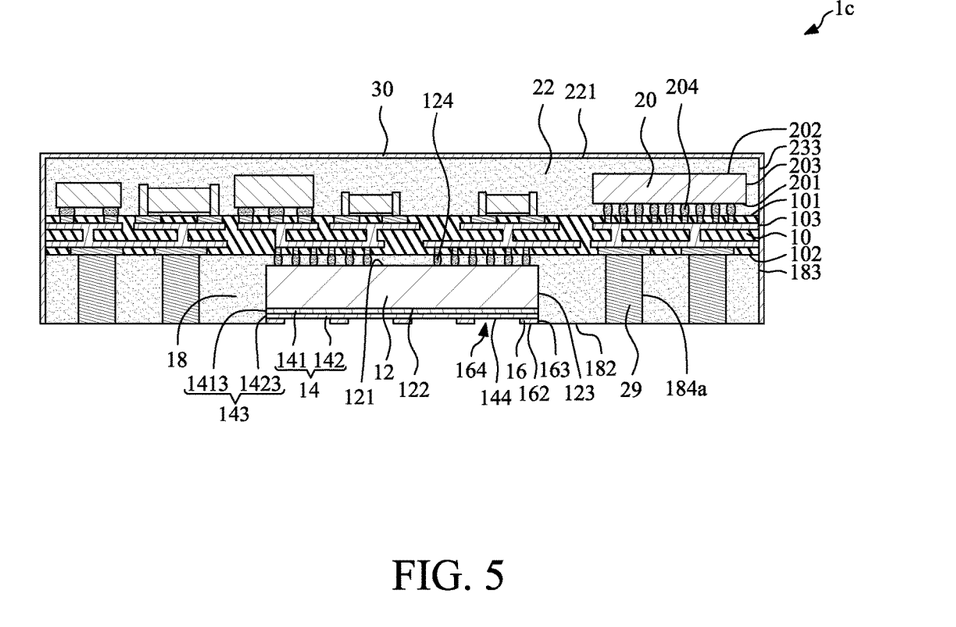
FIG. 5 illustrates a cross-sectional view of some embodiments of a semiconductor package structure according to an aspect of the present disclosure.

FIG. 5 illustrates a cross-sectional view of some embodiments of a semiconductor package structure 1c according to an aspect of the present disclosure. The semiconductor package structure 1c shown in FIG. 5 is similar to the semiconductor package structure 1 as shown in FIG. 1, except that the electrical connectors 26 and the interposer 24 is replaced by a plurality of conductive vias 29. That is, the internal connectors of the semiconductor package structure 1c shown in FIG. 5 are the conductive vias 29. In addition, the first encapsulant 18 defines a plurality of openings 184a extending through the first encapsulant 18 to expose portions of the second surface 102 of the substrate 10. The positions of the openings 184s of the first encapsulant 18 may correspond to the positions of the electrical connectors 26 in FIG. 1. The conductive vias 29 are each disposed in a respective one of the openings 184a of the first encapsulant 18 to connect the second surface 102 of the substrate 10. A material of the conductive via 29 may include copper or another metal or metal alloy. A height of the conductive via 29 may be substantially equal to a sum of a height of the first interconnection elements 124, a thickness of the first semiconductor element 12, a thickness of the heat dissipation structure 14 (including the first metal layer 141 and the second metal layer 142) and a thickness of the insulation layer 16. Thus, a bottom end of the conductive via 29 may be exposed from the second surface 182 of the first encapsulant 18.

Figure 6:
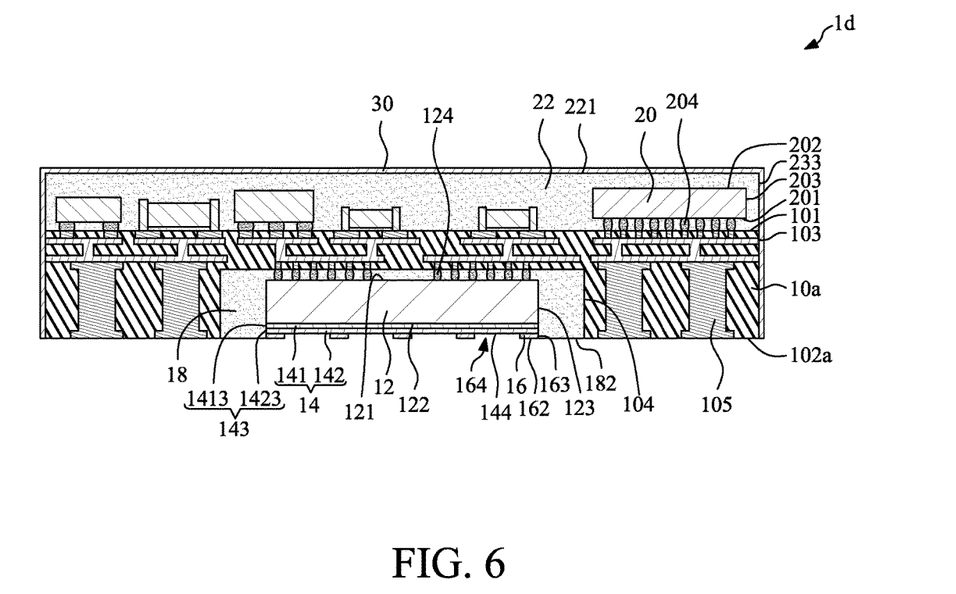
FIG. 6 illustrates a cross-sectional view of some embodiments of a semiconductor package structure according to an aspect of the present disclosure.

FIG. 6 illustrates a cross-sectional view of some embodiments of a semiconductor package structure 1d according to an aspect of the present disclosure. The semiconductor package structure 1d shown in FIG. 6 is similar to the semiconductor package structure 1 as shown in FIG. 1, except that the electrical connectors 26 and the interposer 24 shown in FIG. 1 are omitted and the substrate 10a is a cavity substrate. That is, the substrate 10a has the first surface 101 and the second surface 102a, and defines a cavity 104 that is recessed from the second surface 102a and does not extend through the substrate 10a. The first semiconductor element 12 is attached to the substrate 10a and is accommodated in the cavity 104. The first encapsulant 18 is disposed in the cavity 104. The second surface 182 of the first encapsulant 18 is substantially coplanar with the second surface 102a of the substrate 10a and the second surface 162 of the insulation layer 16. In addition, the substrate 10a may further include a plurality of conductive vias 105 disposed around the cavity 104. A material of the conductive via 105 may include copper or another metal or metal alloy. A height of the conductive via 105 may be substantially equal to a sum of a height of the first interconnection elements 124, a thickness of the first semiconductor element 12, a thickness of the heat dissipation structure 14 (including the first metal layer 141 and the second metal layer 142) and a thickness of the insulation layer 16. Thus, a bottom end of the conductive via 105 may be exposed from the second surface 102a of the substrate 10a.

Figure 7:
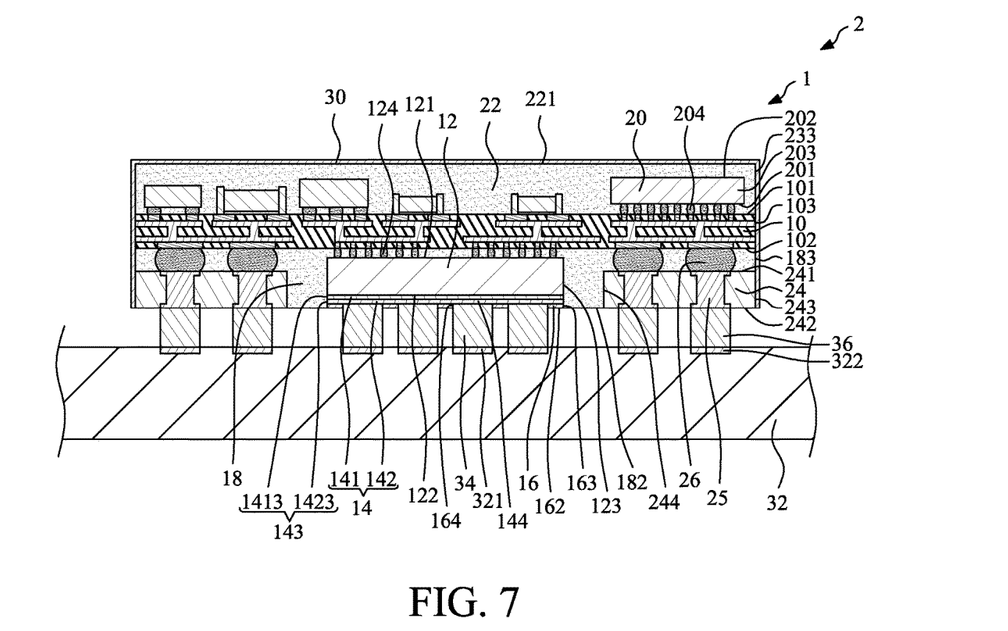
FIG. 7 illustrates a cross-sectional view of some embodiments of a semiconductor device according to an aspect of the present disclosure.

FIG. 7 illustrates a cross-sectional view of some embodiments of a semiconductor device 2 according to an aspect of the present disclosure. The semiconductor package structure 1 of the semiconductor device 2 shown in FIG. 7 is the same as the semiconductor package structure 1 shown in FIG. 1, and is mounted to a circuit board 32 (e.g., a PCB board) by, for example, SMT. The circuit board 32 is disposed apart from the semiconductor package structure 1, and has a plurality of first pads 321 and a plurality of second pads 322. The first pad 321 need not have an electrical function, and may be connected to, or may be part of, a heat dissipation path in the circuit board 32. The second pad 322 may have electrical function, and may be connected to a circuit layer in the circuit board 32. The semiconductor device 2 further includes a plurality of first conductive elements 34 and a plurality of second conductive elements 36 that are used to connect the circuit board 32 and the semiconductor package structure 1. Thus, the circuit board 32 is disposed apart from the semiconductor package structure 1 by the first conductive elements 34 and the second conductive elements 36. The first conductive element 34 may be a solder ball or a solder post, and the second conductive element 36 may be a solder ball or a solder post.

As shown in FIG. 7, each of the first conductive elements 34 connects a respective one of the exposed portions 144 of the heat dissipation structure 14 in the openings 164 of the insulation layer 16 to one of the first pads 321 of the circuit board 32. Each of the second conductive elements 36 connects a bottom end of a respective one of the internal connectors (including the electrical connector 26 and the conductive via 25) to the second pad 322 of the circuit board 32. It is noted that the exposed portions 144 of the heat dissipation structure 14 are separated from each other by the pattern design of the insulation layer 16, thus, when the semiconductor package structure 1 is attached to the circuit board 32, the first conductive elements 34 can hold the semiconductor package structure 1 evenly. Therefore, the semiconductor package structure 1 may not tilt, and a non-wetting issue of the second conductive elements 36 may be reduced. That is, all of the second conductive elements 36 will be secured to connect the semiconductor package structure 1 and the circuit board 32, helping to prevent an open circuit. As a result, the risk of SMT failure will be lowered, and the SMT yield is improved.

In one or more embodiments, a thermal conductivity of the first conductive element 34 is about 60 W/mK and a thermal conductivity of the second conductive elements 36 is also about 60 W/mK. In one example implementation, conditions are: $T_J$ is about 76.7° C., $T_A$ is about 25° C., P is about 2.01 W, and $\theta_{JA}$ is about 25.7° C./W. That is, such an example implementation has a 14% improvement as compared with the above-mentioned first comparative example. Therefore, the efficiency of the heat dissipation technique of the present disclosure is improved.

Figure 8:
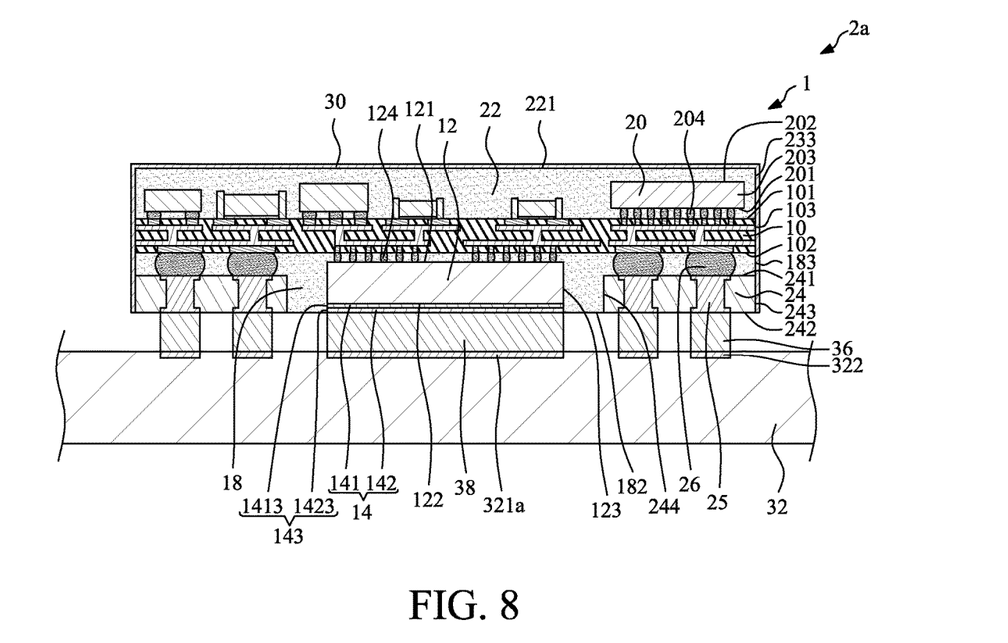
FIG. 8 illustrates a cross-sectional view of some embodiments of a semiconductor device according to an aspect of the present disclosure.

FIG. 8 illustrates a cross-sectional view of some embodiments of a semiconductor device 2a according to an aspect of the present disclosure. The semiconductor device 2a shown in FIG. 8 is similar to the semiconductor device 2 as shown in FIG. 8, except that the insulation layer 16 is omitted, the first conductive elements 34 are replace by a single solder paste 38, and the first pads 321 are replaced by a single pad 321a. The top end of solder paste 38 contacts the second metal layer 142 of the heat dissipation structure 14, and a size or length of the solder paste 38 is substantially equal to a size or length of the second metal layer 142 of the heat dissipation structure 14. In some embodiments, the solder paste 38 is disposed on substantially the entire the second metal layer 142 of the heat dissipation structure 14. The bottom end of solder paste 38 contacts the pad 321a, and a size of the solder paste 38 is substantially equal to a size of the pad 321a.

Figure 9:
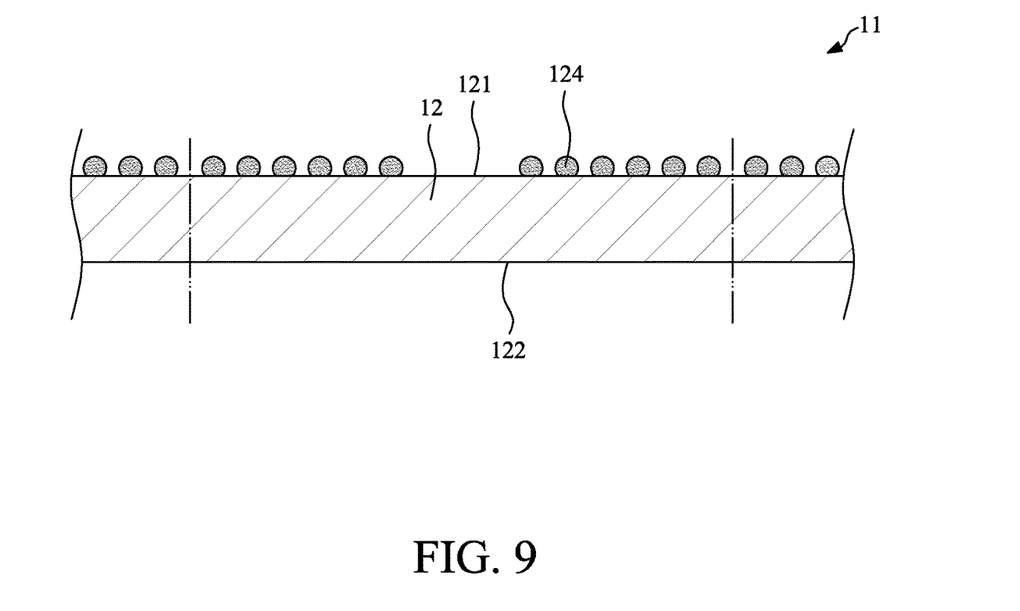
FIG. 9 illustrates one or more stages of some embodiments of a method for manufacturing a semiconductor package structure according to an aspect of the present disclosure.

FIG. 9, FIG. 10, FIG. 11, FIG. 12, FIG. 13, FIG. 14, FIG. 15, FIG. 16 and FIG. 17 illustrate various stages of one or more embodiments of a method for manufacturing a semiconductor package structure according to an aspect of the present disclosure. In the illustrated embodiments, the method is used to manufacture semiconductor package structure such as the semiconductor package structure 1 shown in FIG. 1 and FIG. 2. Referring to FIG. 9, a base element 11 is provided. The base element 11 may include a substrate or a semiconductor wafer, and includes at least one first semiconductor element 12. The first semiconductor element 12 has a first surface 121 (e.g., an active surface), a second surface 122 (e.g., a back side surface) opposite to the first surface 121 and a plurality of first interconnection elements 124 (such as bumps or pillars) disposed on the first surface 121.

Figure 10:
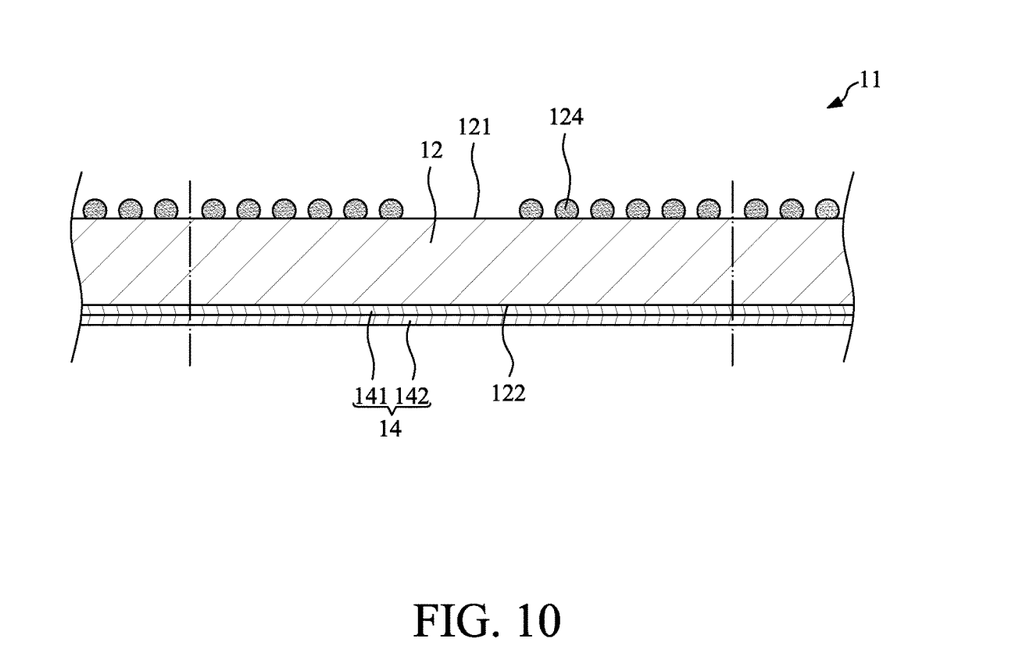
FIG. 10 illustrates one or more stages of some embodiments of a method for manufacturing a semiconductor package structure according to an aspect of the present disclosure.

Referring to FIG. 10, a heat dissipation structure 14 is formed on the second surface 122 of the first semiconductor element 12 (e.g., the back side surface of the base element 11). In one or more embodiments, the heat dissipation structure 14 may include a first metal layer 141 formed on the second surface 122 of the first semiconductor element 12 formed by, e.g., metallization. A material of the first metal layer 141 may include copper or another metal or metal alloy. In one or more embodiments, the heat dissipation structure 14 further includes a second metal layer 142 formed on the first metal layer 141. That is, the first metal layer 141 is disposed between the second metal layer 142 and the second surface 122 of the first semiconductor element 12. A material of the second metal layer 142 may include nickel, gold, a gold-nickel alloy, a nickel-vanadium alloy, palladium or molybdenum. The heat dissipation structure 14 (including the first metal layer 141 and the second metal layer 142) is disposed to cover the second surface 122 of the first semiconductor element 12.

Figure 11:
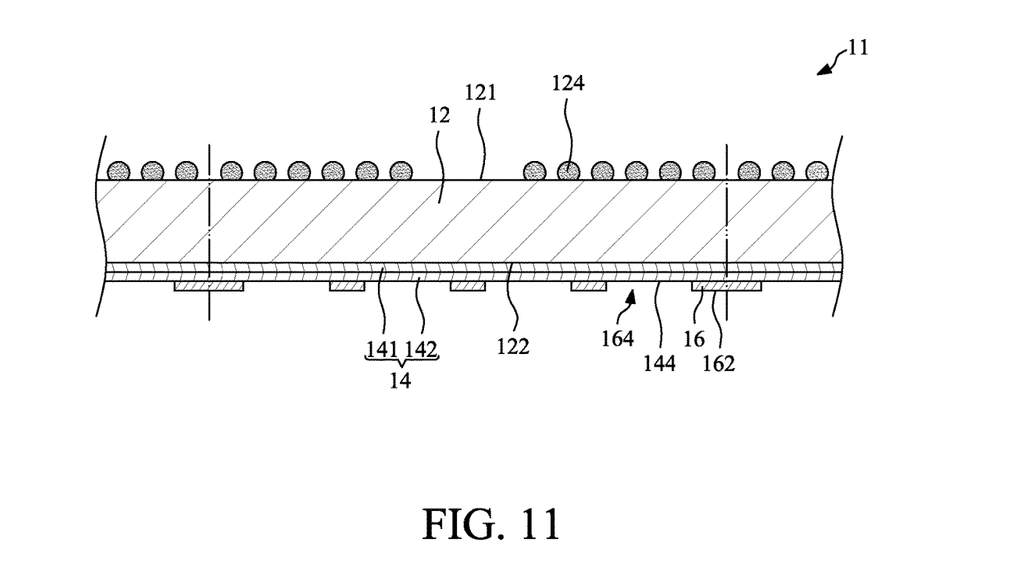
FIG. 11 illustrates one or more stages of some embodiments of a method for manufacturing a semiconductor package structure according to an aspect of the present disclosure.

Referring to FIG. 11, the insulation layer 16 is formed on the heat dissipation structure 14 by, for example, mesh coating. Thus, the insulation layer 16 defines a plurality of openings 164 extending through the insulation layer 16 to expose a plurality of exposed portions 144 of the heat dissipation structure 14. In one or more embodiments, a material of the insulation layer 16 includes a polyimide, polybenzobisoxazole, a polyamide, a photodefinable dielectric material (e.g. TMMR manufactured by TOKYO OHKA KOGYO CO., LTD.), a solder resist or a combination thereof. As shown in FIG. 11, the insulation layer 16 is disposed on the second metal layer 142 of the heat dissipation structure 14, and has a second surface 162.

Figure 12:
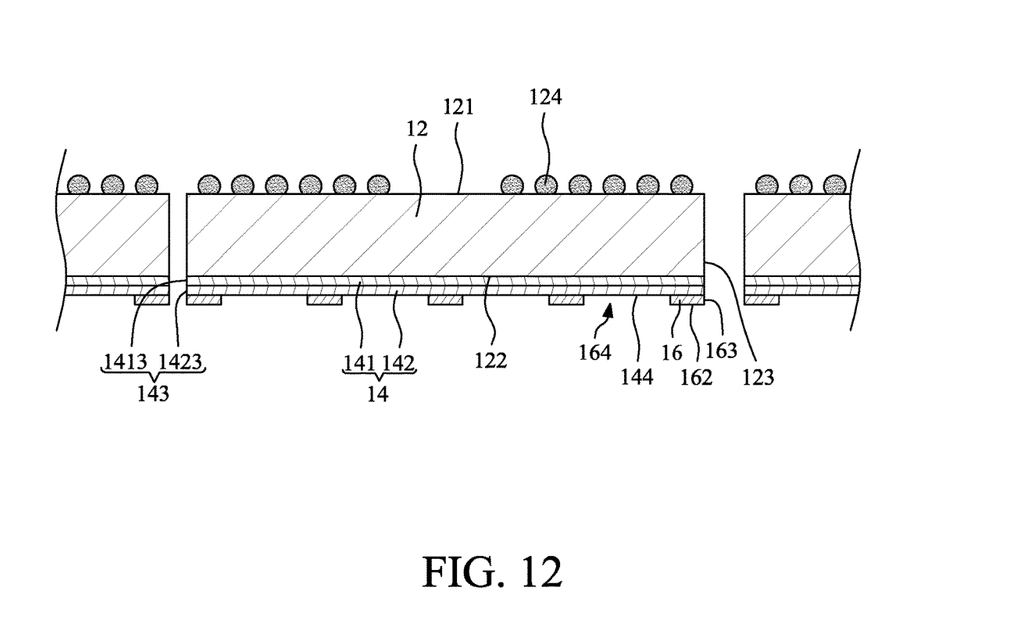
FIG. 12 illustrates one or more stages of some embodiments of a method for manufacturing a semiconductor package structure according to an aspect of the present disclosure.

Referring to FIG. 12, the base element 11 is cut to form a plurality of first semiconductor elements 12. Referring now to one of the first semiconductor elements 12, the first semiconductor element 12 has a side surface 123 extending between the first surface 121 and the second surface 122. The heat dissipation structure 14 has a side surface 143 (including a side surface 1413 of the first metal layer 141 and a side surface 1423 of the second metal layer 142). The insulation layer 16 has a side surface 163. The side surface 163 of the insulation layer 16 is substantially coplanar with the side surface 143 (including the side surface 1413 of the first metal layer 141 and the side surface 1423 of the second metal layer 142) of the heat dissipation structure 14 and the side surface 123 of the first semiconductor element 12.

Figure 13:
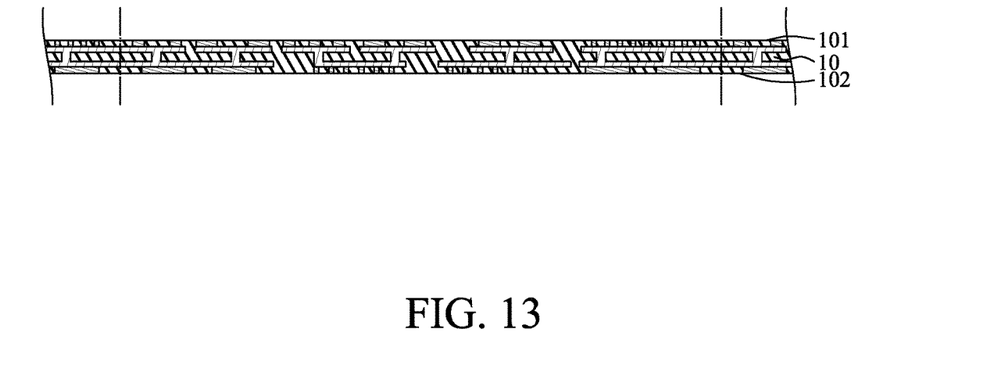
FIG. 13 illustrates one or more stages of some embodiments of a method for manufacturing a semiconductor package structure according to an aspect of the present disclosure.

Referring to FIG. 13, a substrate 10 is provided. In some embodiments, the substrate 10 can be similar to the substrate 10 illustrated in FIG. 1. The substrate 10 shown in FIG. 13 can be a strip type substrate structure or a panel type substrate structure. The substrate 10 can be a package substrate, and can have a first surface 101 and a second surface 102 opposite to the first surface 101. The substrate 10 may be an organic substrate or an inorganic substrate. For example, the material of the substrate 10 may include a glass-reinforced epoxy resin material (e.g., an FR4 grade material), bismaleimide triazine (BT), epoxy, silicon, PCB material, glass or ceramic.

Figure 14:
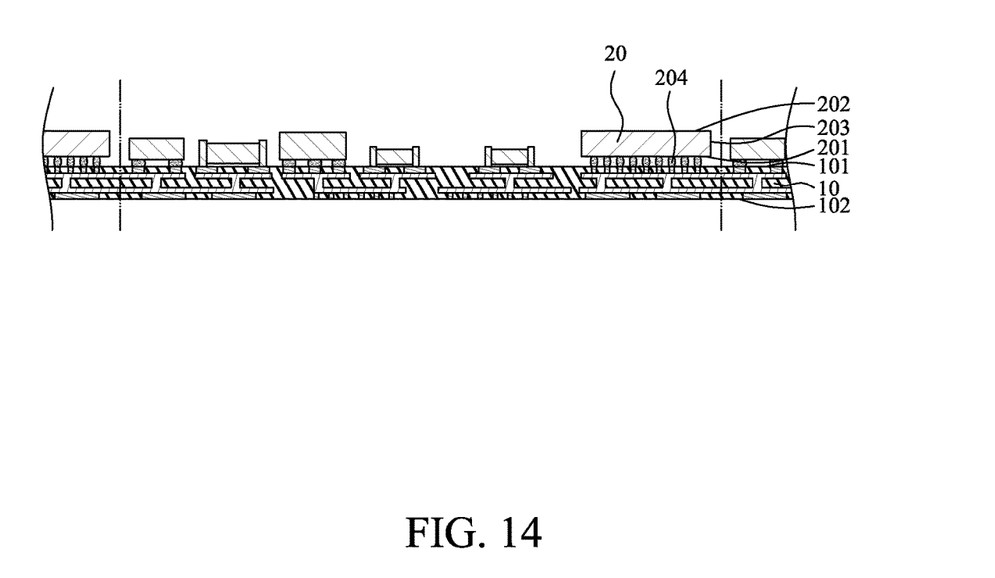
FIG. 14 illustrates one or more stages of some embodiments of a method for manufacturing a semiconductor package structure according to an aspect of the present disclosure.

Referring to FIG. 14, at least one second semiconductor element 20 is attached or mounted to and electrically connected to the first surface 101 of the substrate 10. In some embodiments, the second semiconductor element 20 may include at least one semiconductor die (e.g., a WiFi module) and/or at least one passive element. The second semiconductor element 20 has a first surface 201 (e.g., an active surface), a second surface 202 (e.g., a back side surface) and a side surface 203. The second surface 202 is opposite to the first surface 201, and the side surface 203 extends between the first surface 201 and the second surface 202. The first surface 201 of the second semiconductor element 20 faces the first surface 101 of the substrate 10, and is electrically connected to the first surface 101 of the substrate 10 through a plurality of second interconnection elements 204, such as bumps or pillars. For example, the second semiconductor element 20 may be attached to the first surface 101 of the substrate 10 by flip chip bonding.

Figure 15:
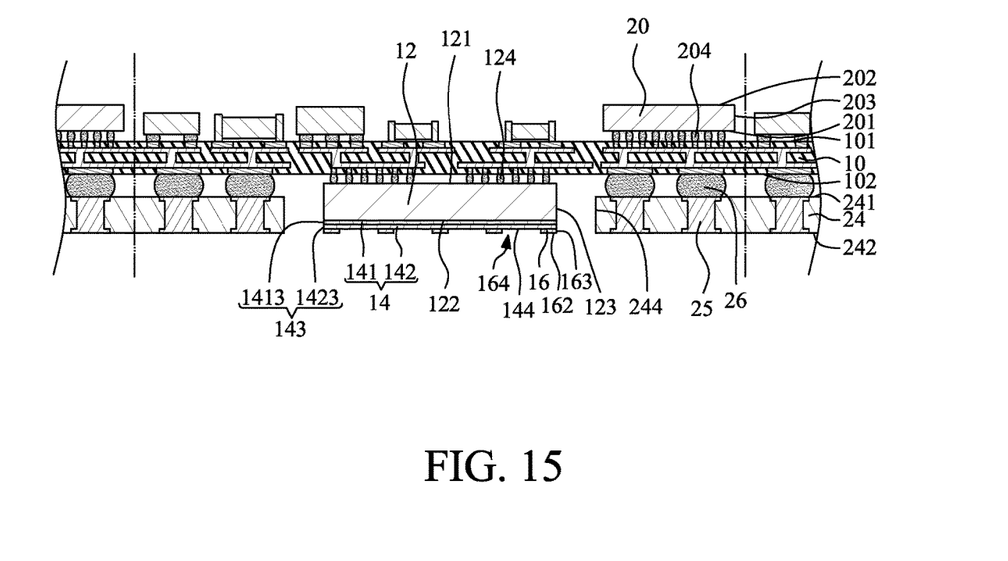
FIG. 15 illustrates one or more stages of some embodiments of a method for manufacturing a semiconductor package structure according to an aspect of the present disclosure.

Referring to FIG. 15, at least one of the first semiconductor elements 12 and an interposer 24 are attached or mounted to and electrically connected to the second surface 102 of the substrate 10. The first surface 121 of the first semiconductor element 12 faces the second surface 102 of the substrate 10, and is electrically connected to the second surface 102 of the substrate 10 through the first interconnection elements 124. For example, the first semiconductor element 12 may be attached to the second surface 102 of the substrate 10 by flip chip bonding.

The interposer 24 has a first surface 241 and a second surface 242, and defines a through hole 244. The second surface 242 is opposite to the first surface 241. The through hole 244 extends through the interposer 24. The material of the interposer 24 may include an organic material or an inorganic material. For example, the material of the interposer 24 may include a glass-reinforced epoxy resin material (e.g., an FR4 grade material), bismaleimide triazine (BT), epoxy, silicon, PCB material, glass or ceramic. The first surface 241 of the interposer 24 is attached to the second surface of the substrate 10 through a plurality of electrical connectors 26. The through hole 244 can be used for accommodating the first semiconductor element 12. That is, the first semiconductor element 12 is located in the through hole 244 of the interposer 24. In one or more embodiments, the interposer 24 may include a plurality of conductive vias 25 extending the interposer 24 and disposed around the through hole 244. The material of the conductive vias 25 may include copper or another metal or metal alloy.

The electrical connectors 26 are disposed between the first surface 241 of the interposer 24 and the second surface of the substrate 10 so as to physically connecting and electrically connecting the interposer 24 to the substrate 10. The electrical connectors 26 may be solder balls, and may be connected to a top end of respective one of the conductive vias 25, whereas a bottom end of each of the conductive vias 25 may be exposed from the interposer 24 for external connection. In one or more embodiments, a combination of the electrical connector 26 and the conductive via 25 can constitute an internal connector. One end of the internal connector is electrically connected to the substrate 10, and the other end of the internal connector is exposed for external connection. It is noted that the combination of the electrical connector 26 and the conductive via 25 may be replaced by a solder ball, two stacked solder ball, or a conductive via. As shown in FIG. 15, a sum of a height of the first interconnection element 124, a thickness of the first semiconductor element 12, a thickness of the heat dissipation structure 14 (including the first metal layer 141 and the second metal layer 142) and a thickness of the insulation layer 16 is substantially equal to a sum of a height of the electrical connector 26 and a length of the conductive via 25.

Figure 16:
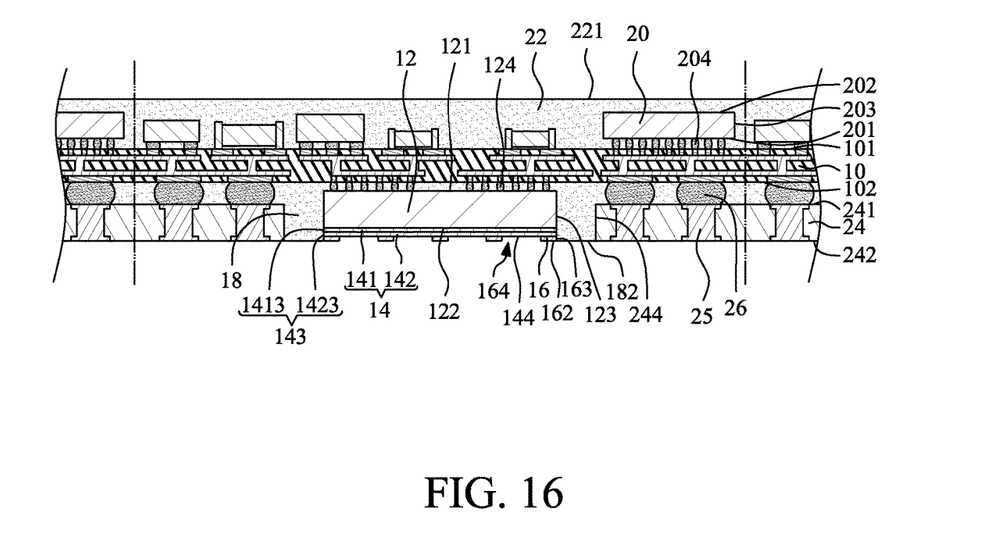
FIG. 16 illustrates one or more stages of some embodiments of a method for manufacturing a semiconductor package structure according to an aspect of the present disclosure.

Referring to FIG. 16, a first encapsulant 18 is formed or disposed on the second surface 102 of the substrate 10 and a second encapsulant 22 is formed or disposed on the first surface 101 of the substrate 10. In some embodiments, the first encapsulant 18 and the second encapsulant 22 may be formed concurrently through a through hole extending through the substrate 10 during one stage, which is referred to as "double side molding." As shown in FIG. 16, the first encapsulant 18 extends into a gap between the first semiconductor element 12 and a sidewall of the through hole 244 of the interposer 24. Thus, the first encapsulant 18 covers at least a portion of the side surface 123 of the first semiconductor element 12, and further covers the interposer 24 and the electrical connector 26. The material of the first encapsulant 18 may include a molding compound. The first encapsulant 18 has a second surface 182. The second surface 182 of the first encapsulant 18 is substantially coplanar with the second surface 242 of the interposer 24 and the second surface 162 of the insulation layer 16. For example, the first encapsulant 18 exposes at least a portion of the second surface 162 of the insulation layer 16 (e.g. does not extend onto the second surface 162 of the insulation layer 16). Thus, the insulation layer 16 and the exposed portions 144 of the heat dissipation structure 14 may be exposed from the first encapsulant 18. In addition, a portion of the first encapsulant 18 may further extend into the space between the first semiconductor element 12 and the second surface 102 of the substrate 10 to surround and protect the first interconnection elements 124 (e.g., the first encapsulant 18 may serve as a MUF). In some embodiments, there may be an underfill disposed in the space between the first semiconductor element 12 and the second surface 102 of the substrate 10 to surround and protect the first interconnection elements 124.

As shown in FIG. 16, the second encapsulant 22 covers the second semiconductor element 20. The material of the second encapsulant 22 may include a molding compound. The second encapsulant 22 has a first surface 221. The first surface 221 of the second encapsulant 22 is higher than the second surface 202 of the second semiconductor element 20. In addition, a portion of the second encapsulant 22 may extend into the space between the second semiconductor element 20 and the first surface 101 of the substrate 10 to surround and protect the second interconnection elements 204 (e.g., the second encapsulant 22 may serve as a MUF). In some embodiments, there may be an underfill disposed in the space between the second semiconductor element 20 and the first surface 101 of the substrate 10 to surround and protect the second interconnection elements 204.

Figure 17:
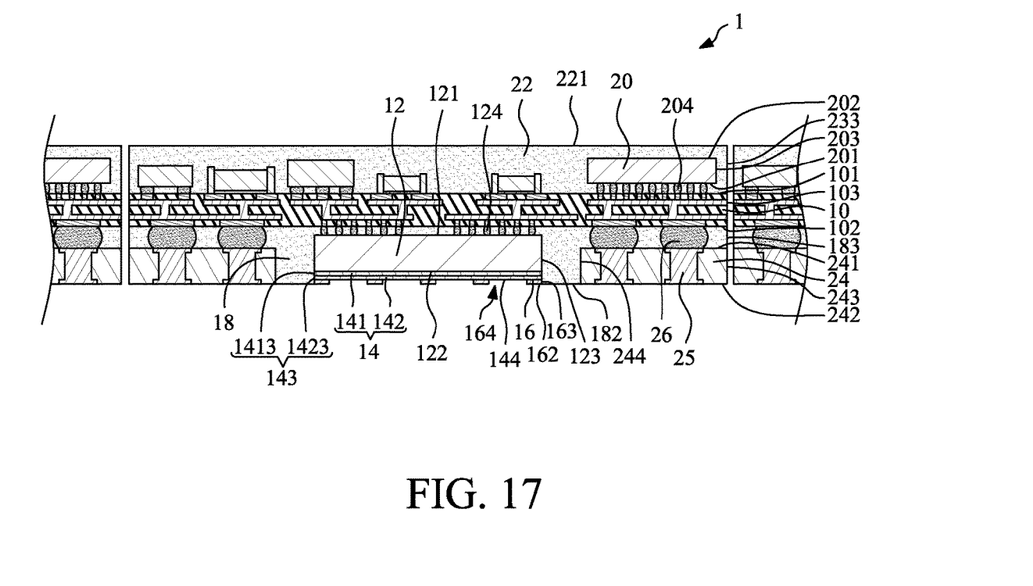
FIG. 17 illustrates one or more stages of some embodiments of a method for manufacturing a semiconductor package structure according to an aspect of the present disclosure.

Referring to FIG. 17, a singulation process or a cutting process is conducted so as to obtain a plurality of individual semiconductor package structures 1 as shown in FIG. 1. After the singulation process, the second encapsulant 22 has a side surface 223, the substrate 10 has a side surface 103, the first encapsulant 18 has a side surface 183, and the interposer 24 has a side surface 243. The side surface 223 of the second encapsulant 22, the side surface 103 of the substrate 10, the side surface 183 of the first encapsulant 18 and the side surface 243 of the interposer 24 are substantially coplanar with each other.

In some embodiments, a shielding layer 30 (see FIG. 1) is further formed on the side surface 223 of the second encapsulant 22, a side surface 103 of the substrate 10, a side surface 183 of the first encapsulant 18 and the side surface 243 of the interposer 24. The shielding layer 30 may include at least one metal layer and may be formed by plating or sputtering.

As used herein, the singular terms "a," "an," and "the" may include plural referents unless the context clearly dictates otherwise.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

In the description of some embodiments, a component provided "on" another component can encompass cases where the former component is directly on (e.g., in physical or direct contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
    a substrate;
    at least one first semiconductor element attached to the substrate, and having a first surface, a second surface opposite to the first surface, and a side surface extending between the first surface and the second surface, wherein the first surface of the at least one first semiconductor element faces the substrate;
    a heat dissipation structure disposed on the second surface of the first semiconductor element;
    an insulation layer having a bottom surface, the insulation layer disposed on the heat dissipation structure, and defining a plurality of openings extending through the insulation layer and exposing a plurality of exposed portions of the heat dissipation structure; and
    a first encapsulant covering the side surface of the at least one first semiconductor element and having a bottom surface substantially coplanar with the bottom surface of the insulation layer.

2. The semiconductor package structure according to claim 1, wherein a length of the heat dissipation structure is substantially equal to a length of the second surface of the at least one first semiconductor element.

3. The semiconductor package structure according to claim 1, wherein a side surface of the heat dissipation structure is substantially coplanar with the side surface of the at least one first semiconductor element.

4. The semiconductor package structure according to claim 1, wherein the heat dissipation structure includes a first metal layer.

5. The semiconductor package structure according to claim 4, wherein the first metal layer includes copper.

6. The semiconductor package structure according to claim 4, wherein the heat dissipation structure further includes a second metal layer, and the first metal layer is disposed between the second metal layer and the second surface of the at least one first semiconductor element.

7. The semiconductor package structure according to claim 6, wherein the second metal layer includes nickel, gold, a gold-nickel alloy, a nickel-vanadium alloy, palladium or molybdenum.

8. The semiconductor package structure according to claim 1, wherein the insulation layer includes a polyimide, polybenzobisoxazole, a polyamide, a dielectric material, a solder resist or a combination thereof.

9. The semiconductor package structure according to claim 1, wherein a width of at least one of the openings of the insulation layer is in a range of about 0.1 millimeters (mm) to about 3 mm.

10. The semiconductor package structure according to claim 1, wherein a gap between two openings of the insulation layer is in a range of about 0.1 mm to about 0.5 mm.

11. The semiconductor package structure according to claim 1, wherein the substrate has a first surface and a second surface opposite to the first surface, the first surface of the at least one first semiconductor element faces the second surface of the substrate, and the semiconductor package structure further comprises:
    at least one second semiconductor element attached to the first surface of the substrate; and
    a second encapsulant disposed on the first surface of the substrate covering the second semiconductor element.

12. The semiconductor package structure according to claim 11, further comprising a shielding layer disposed on a side surface of the second encapsulant and a side surface of the substrate.

13. A semiconductor device, comprising:
    a semiconductor package structure comprising:
        a substrate;
        at least one first semiconductor element attached to the substrate, and having a first surface, a second surface opposite to the first surface, and a side surface extending between the first surface and the second surface, wherein the first surface of the at least one first semiconductor element faces the substrate;
        a heat dissipation structure disposed on the second surface of the at least one first semiconductor element;
        an insulation layer having a bottom surface, the insulation layer disposed on the heat dissipation structure, and defining a plurality of openings extending through the insulation layer and exposing a plurality of portions of the heat dissipation structure; and
        an encapsulant covering the side surface of the at least one first semiconductor element and having a bottom surface substantially coplanar with the bottom surface of the insulation layer;
    a circuit board disposed apart from the semiconductor package structure; and
    a plurality of first conductive elements connecting the exposed portions of the heat dissipation structure to the circuit board.

14. The semiconductor device according to claim 13, wherein the semiconductor package structure further comprises at least one internal connector electrically connected to the substrate, and the semiconductor device further comprises a plurality of second conductive elements electrically connecting the at least one internal connector to the circuit board.

15. The semiconductor device according to claim 14, wherein one or more of the second conductive elements is a solder ball or a solder post.

16. The semiconductor device according to claim 13, wherein one or more of the first conductive elements is a solder ball or a solder post.

17. A method for manufacturing a semiconductor package structure, comprising:
    providing at least one first semiconductor element having a first surface, a second surface opposite to the first surface, and a side surface extending between the first surface and the second surface;
    forming a heat dissipation structure on the second surface of the at least one first semiconductor element;
    forming an insulation layer on the heat dissipation structure, wherein the insulation layer has a bottom surface and defines a plurality of openings extending through the insulation layer and exposing a plurality of portions of the heat dissipation structure;

mounting the at least one first semiconductor element to a substrate; and forming a first encapsulant to cover the side surface of the at least one first semiconductor element, wherein the first encapsulant has a bottom surface substantially coplanar with the bottom surface of the insulation layer.

18. The method according to claim 17, wherein mounting the first semiconductor element to the substrate comprises mounting the at least one first semiconductor element to a first surface of the substrate, and the method further comprises:

mounting at least one second semiconductor element to a second surface of the substrate; and forming a second encapsulant to cover the at least one second semiconductor element.

19. The method according to claim 18, further comprising:

forming a shielding layer on a side surface of the second encapsulant, a side surface of the substrate and a side surface of the first encapsulant.

* * * * *